US012740281B2

(12) United States Patent
Qiu

(10) Patent No.: US 12,740,281 B2
(45) Date of Patent: Sep. 15, 2026

(54) DISPLAY PANEL, MANUFACTURING METHOD THEREOF, AND DISPLAY APPARATUS

(71) Applicant: Wuhan Tianma Micro-Electronics Co., Ltd., Wuhan (CN)

(72) Inventor: Shaoya Qiu, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 343 days.

(21) Appl. No.: 18/652,045

(22) Filed: May 1, 2024

(65) Prior Publication Data

US 2025/0176392 A1 May 29, 2025

(30) Foreign Application Priority Data

Nov. 27, 2023 (CN) ........................ 202311605803.5

(51) Int. Cl.

*H10K 59/35* (2023.01)
*H10K 59/12* (2023.01)
*H10K 71/16* (2023.01)

(52) U.S. Cl.

CPC ....... *H10K 59/353* (2023.02); *H10K 59/1201* (2023.02); *H10K 59/351* (2023.02); *H10K 59/352* (2023.02); *H10K 71/166* (2023.02)

(58) Field of Classification Search

CPC ... H10K 59/353; H10K 59/351; H10K 59/352
See application file for complete search history.

(56) References Cited

U.S. PATENT DOCUMENTS 9,461,258 B2 * 10/2016 Seo ..................... G09G 3/3233
9,490,446 B2 * 11/2016 Lee ..................... H10H 20/83
2014/0319486 A1 * 10/2014 Hong ..................... G09G 3/32 257/40
2016/0240593 A1 * 8/2016 Gu ..................... G09G 3/2003
2018/0005561 A1 * 1/2018 Moon ..................... G09G 3/2003
2021/0036067 A1 * 2/2021 Kim ..................... H10K 59/352
2024/0224569 A1 * 7/2024 Lim ..................... H10K 50/13

FOREIGN PATENT DOCUMENTS

CN 101026185 A 8/2007

* cited by examiner

*Primary Examiner* — Lauren R Bell
(74) *Attorney, Agent, or Firm* — Anova Law Group, PLLC

(57) ABSTRACT

A display panel includes a plurality of pixels that is arranged in a matrix. One pixel of the plurality of pixels has a first sub-pixel, a second sub-pixel, a third sub-pixel, and a fourth sub-pixel. The third sub-pixel and the fourth sub-pixel have a same color. In the pixel, the first sub-pixel is adjacent to the second sub-pixel, the third sub-pixel, and the fourth sub-pixel. Along a matrix column direction, in adjacent pixels, at least a portion of sub-pixels of a same color are adjacently arranged; and in the adjacent pixels, light-emitting layers of the sub-pixels of a same color are connected.

16 Claims, 11 Drawing Sheets

X
Y
L8
L7
L5
L6
11
23
21
24
22
22
23
12
21
24

DISPLAY PANEL, MANUFACTURING METHOD THEREOF, AND DISPLAY APPARATUS

CROSS-REFERENCE TO RELATED APPLICATION

This application claims priority to Chinese Patent Application No. 202311605803.5, filed on Nov. 27, 2023, the entire content of which is incorporated herein by reference.

TECHNICAL FIELD

The present disclosure relates to the field of display technology and, in particular, to a display panel, a manufacturing method thereof, and a display apparatus.

BACKGROUND

One of the important factors measuring the display effect of a display panel is the aperture ratio. A high aperture ratio of the display panel leads to a high efficiency of light transmission and an excellent display effect.

In a process of depositing light-emitting materials of Organic Light-Emitting Diode (OLED), sub-pixels of each color are usually deposited by different deposition openings of a mask. It is necessary to reserve a deposition margin between different deposition openings to avoid overlapping and mixing of organic materials of different colors. This increases the non-light-emitting area in the display panel, thereby restricting the aperture ratio and affecting the display effect and product service life.

SUMMARY

One aspect of the present disclosure provides a display panel. The display panel includes a plurality of pixels that is arranged in a matrix. One pixel of the plurality of pixels has a first sub-pixel, a second sub-pixel, a third sub-pixel, and a fourth sub-pixel. The third sub-pixel and the fourth sub-pixel have a same color. In the pixel, the first sub-pixel is adjacent to the second sub-pixel, the third sub-pixel, and the fourth sub-pixel. Along a matrix column direction, in adjacent pixels, at least a portion of sub-pixels of a same color are adjacently arranged; and in the adjacent pixels, light-emitting layers of the sub-pixels of a same color are connected.

One aspect of the present disclosure provides a manufacturing method of a display panel. The manufacturing method includes providing a motherboard and using a mask to generate a light-emitting layer on the motherboard to form a plurality of pixels and obtain the display panel. The plurality of pixels is arranged in a matrix. One pixel of the plurality of pixels has a first sub-pixel, a second sub-pixel, a third sub-pixel, and a fourth sub-pixel. The third sub-pixel and the fourth sub-pixel have a same color. In the pixel, the first sub-pixel is adjacent to the second sub-pixel, the third sub-pixel, and the fourth sub-pixel. Along a matrix column direction, in adjacent pixels, at least a portion of sub-pixels of a same color are adjacently arranged; and in the adjacent pixels, light-emitting layers of the sub-pixels of the same color are connected.

Another aspect of the present disclosure provides a display apparatus. The display apparatus includes a display panel. The display panel includes a plurality of pixels that is arranged in a matrix. One pixel of the plurality of pixels has a first sub-pixel, a second sub-pixel, a third sub-pixel, and a fourth sub-pixel. The third sub-pixel and the fourth sub-pixel have a same color. In the pixel, the first sub-pixel is adjacent to the second sub-pixel, the third sub-pixel, and the fourth sub-pixel. Along a matrix column direction, in adjacent pixels, at least a portion of sub-pixels of a same color are adjacently arranged; and in the adjacent pixels, light-emitting layers of the sub-pixels of the same color are connected.

BRIEF DESCRIPTION OF THE DRAWINGS

Drawings, which are incorporated in and constitute a part of this specification, illustrate embodiments consistent with the disclosure. Together with the description, the drawings serve to explain the principles of the disclosure.

In order to better illustrate embodiments of the present disclosure or technical solutions in related technologies, the drawings to describe embodiments or the related technologies will be briefly demonstrated below. Obviously, for those persons of ordinary skill in the art, additional drawings can be obtained based on the drawings without exerting creative labor.

DETAILED DESCRIPTION OF THE EMBODIMENTS

In order to better convey the above objectives, features, and advantages of the present disclosure, technical solutions of the present disclosure will be further described below. It should be noted that, as long as there is no conflict, embodiments of the present disclosure and the features in embodiments can be combined with each other.

Many specific details are outlined in the following description to fully understand the present disclosure. However, the present disclosure can also be implemented in other ways different from those described here.

Figure 1:
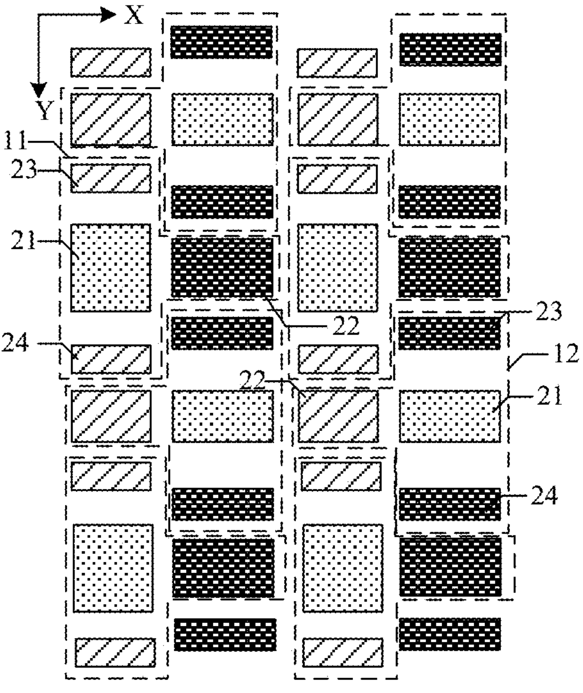
FIG. 1 illustrates a schematic diagram of a partial pixel arrangement structure of a display panel according to various embodiments of the present disclosure.

One embodiment of the present disclosure provides a display panel. As shown in FIG. 1, the display panel includes a plurality of pixels. The plurality of pixels respectively includes a first pixel 11 and a second pixel 12, and the plurality of pixels is arranged in a matrix. One pixel of the plurality of pixels includes a first sub-pixel 21, a second sub-pixel 22, a third sub-pixel 23, and a fourth sub-pixel 24. The third sub-pixel 23 and the fourth sub-pixel 24 have a same color.

Specifically, as shown in FIG. 1, first sub-pixels 21 in the first pixel 11 and the second pixel 12 have a same color. The second sub-pixel 22 in the first pixel 11 has a same color with the third sub-pixel 23 and the fourth sub-pixel 24 in the second pixel 12. The second sub-pixel 22 in the second pixel 12 has a same color with the third sub-pixel and the fourth sub-pixel 24 in the first pixel 11. In a specific embodiment, in addition to the above-mentioned different points, the first pixel 11 and the second pixel 12 are same. The pixel mentioned in the following embodiments can be the first pixel 11 or the second pixel 12.

In the pixel, the first sub-pixel 21 is adjacent to the second sub-pixel 22, the third sub-pixel 23, and the fourth sub-pixel 24. That means the second sub-pixel 22, the third sub-pixel 23, and the fourth sub-pixel 24 are arranged around the first sub-pixel 21.

Along a matrix column direction (i.e., the Y direction in FIG. 1), at least some sub-pixels with a same color in adjacent pixels are arranged adjacently. The light-emitting layer of sub-pixels with a same color in adjacent pixels are connected.

Specifically, as shown in FIG. 1, the third sub-pixel 23 or the fourth sub-pixel 24 in the first pixel 11 are arranged adjacent to the second sub-pixel 22 in an adjacent second pixel 12 along the matrix column direction. Their light-emitting layers are also connected. The second sub-pixel 22 in the first pixel 11 is arranged adjacent to the third sub-pixel 23 or the fourth sub-pixel 24 in an adjacent second pixel 12 along the matrix column direction. Their light-emitting layers are also connected.

In a pixel arrangement of the display panel provided by the present disclosure, a sub-pixel in one pixel can be adjacent to another sub-pixel in another pixel. Light-emitting layers of adjacent sub-pixels of the same color are connected. The adjacent sub-pixels can share a deposition opening, which increases an aperture ratio as well as improves the display effect and the service life of the display panel. At the same time, one pixel is divided into four sub-pixels to make the display effect more delicate, further improving the display effect of the display panel.

Figure 2:
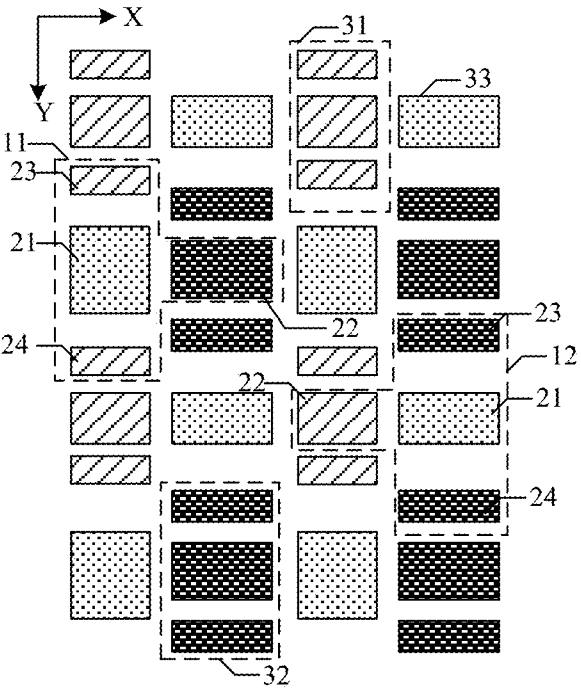
FIG. 2 illustrates a schematic diagram of a partial pixel arrangement structure of another display panel according to various embodiments of the present disclosure.

In some embodiments, along the matrix column direction, at least a portion of the sub-pixels of a same color in three adjacent pixels are adjacently arranged. Light-emitting layers of the sub-pixels of a same color in the three adjacent pixels are connected. Three adjacent sub-pixels of a same color, of which light-emitting layers are connected, constitute a light-emitting layer deposition area. As shown in FIG. 2, the second sub-pixel 22 of one second pixel 12 is adjacently arranged to the third sub-pixel 23 in one first pixel 11 and the fourth sub-pixel 24 in another first pixel 11, and their light-emitting layers are connected to form a first light-emitting layer deposition area 31. The second sub-pixel 22 in one first pixel 11 is adjacently arranged to the third sub-pixel 23 in one second pixel 12 and the fourth sub-pixel 24 in another second pixel 12 and their light-emitting layers are connected to form a second light-emitting layer deposition area 32. Optionally, the first sub-pixel 21 in each pixel independently constitutes a third light-emitting layer deposition area 33.

Figure 3:
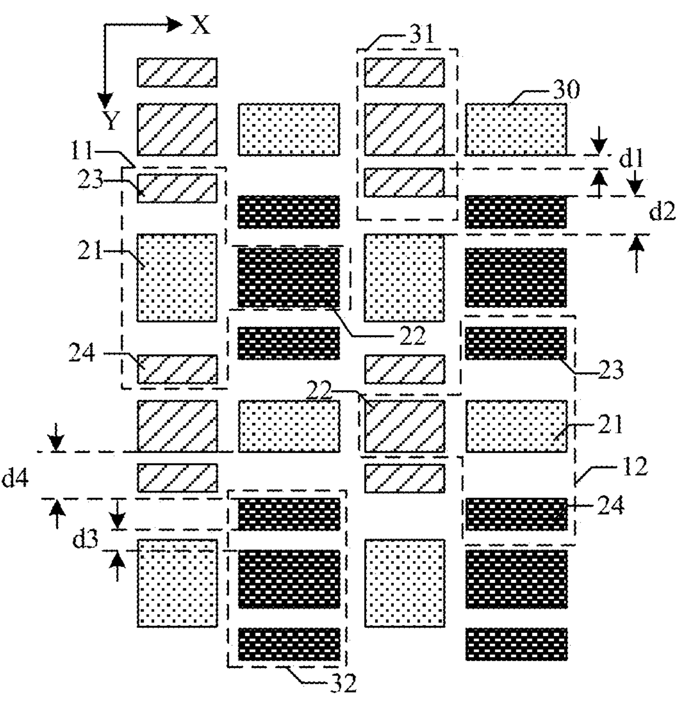
FIG. 3 illustrates a schematic diagram of a partial pixel arrangement structure of another display panel according to various embodiments of the present disclosure.

As a size of the deposition opening of the mask is larger than a size of an actual deposited light-emitting layer, that is, there is a deposition margin between the light-emitting layers generated by different masks in the display panel. A plurality of sub-pixels shares one deposition opening. This can reduce the existence of deposition margin and improve the aperture ratio of the display panel. As shown in FIG. 3, minimum distances between boundaries of two sub-pixels of a same color that are adjacently arranged (i.e., generated by a same deposition opening) can be recorded as a first distance d1 and a third distance d3. Minimum distances between boundaries of two sub-pixels of different colors that are adjacently arranged (i.e., generated by different deposition openings) are recorded as a second distance d2 and a fourth distance d4. In some optional embodiments, the first distance d1 can be smaller than the second distance d2, and the third distance d3 can be smaller than the fourth distance d4 to increase the aperture ratio.

Optionally, the first distance d1 and the third distance d3 can be greater than or equal to 3 microns, while less than or equal to 10 microns. The second distance d2 and the fourth distance d4 can be greater than or equal to 15 microns, while less than or equal to 25 microns.

Figure 4:
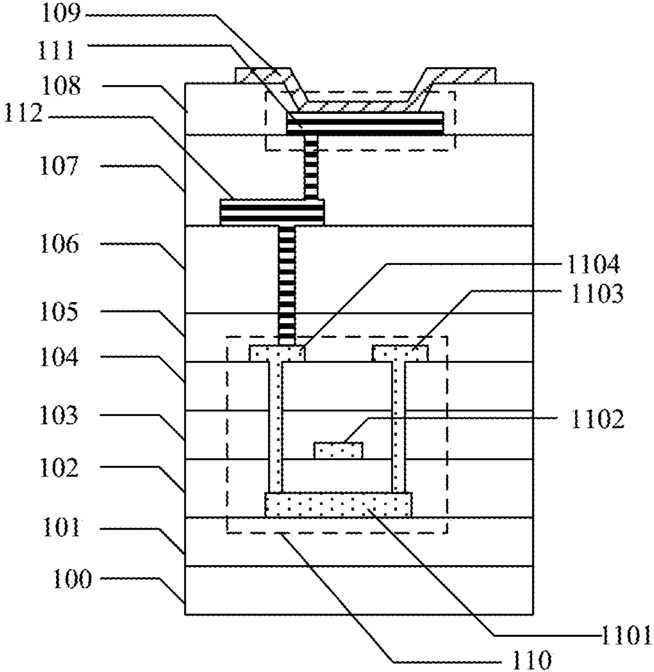
FIG. 4 illustrates a schematic diagram of a partial cross-sectional structure of a display panel according to various embodiments of the present disclosure.

Specifically, a pixel area and a light-emitting layer area are different. Even if light-emitting layers of two sub-pixels are connected, when two sub-pixels emit light electroluminescently, they will appear as two independent sub-pixels. In a specific embodiment, as shown in FIG. 4, it is a cross-sectional view of the display panel in the area where a sub-pixel is located in the display panel. The film layer structure sequentially includes a substrate 100, a buffer layer 101, a gate insulation layer 102, an interlayer material dielectric layer 103, an interlayer dielectric layer 104, a passivation layer 105, a first planarization layer 106, a second PLN layer 107, a pixel defining layer 108, and a light-emitting layer 109. At the same time, among the above-mentioned film layers, the display panel also includes a pixel driving circuit 110, a metal transfer layer 112, and an anode 111. The pixel driving circuit includes an active layer 1101, a gate electrode 1102, a source electrode 1103, and a drain electrode 1104. Specifically, as shown in FIG. 4, through isolation of the pixel defining layer 108, the light-emitting layer 109 includes a portion in contact with the anode 111 and a portion that is not in contact with the anode 111. Only the portion of the light-emitting layer 109 in contact with the anode 111 can emit light electroluminescently and be displayed as an independent sub-pixel.

Figure 5:
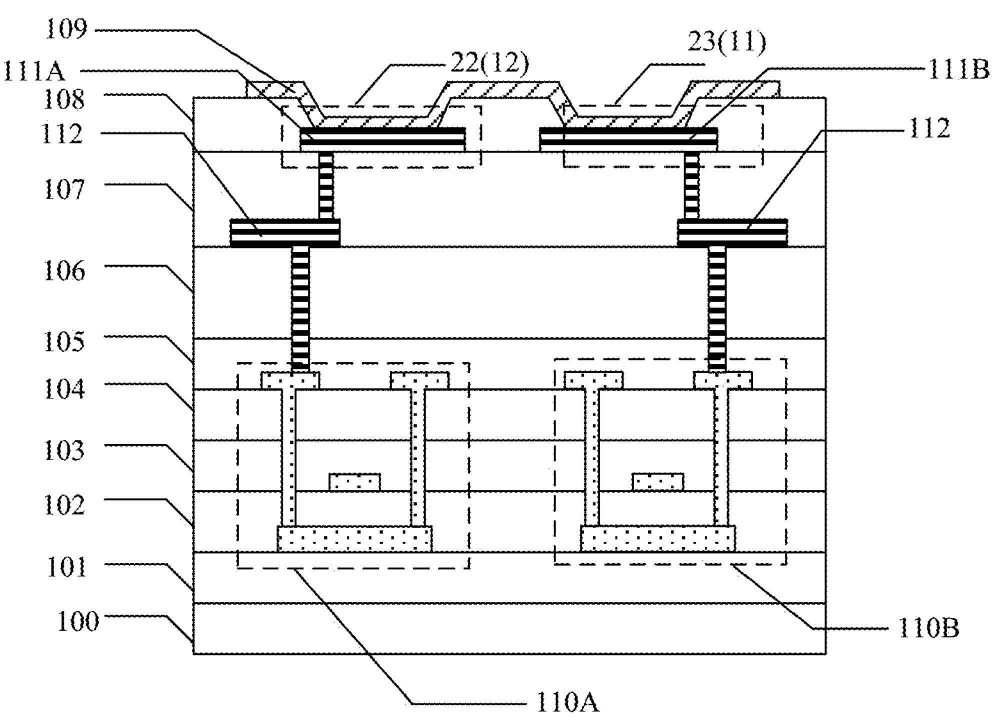
FIG. 5 illustrates a schematic diagram of a partial cross-sectional structure of another display panel according to various embodiments of the present disclosure.

In some embodiments, as shown in FIG. 5, the display panel further includes a plurality of anodes. FIG. 5 illustrates a first anode 111A and a second anode 111B. Two sub-pixels are located in two adjacent pixels of which light-emitting layers are connected to different pixel driving circuits through different anodes.

FIG. 5 shows a cross-sectional view of the second sub-pixel 22 in one second pixel 12 and the third sub-pixel 23 in the first pixel 11 that is adjacent to the second pixel 12 along the matrix column direction in the display panel. As shown in FIG. 5, the adjacent and connected light-emitting layers are respectively connected to the first anode 111A and the second anode 111B, and are respectively connected to the first pixel driving circuit 110A and the second pixel driving circuit 110B through the first anode 111A and the second anode 111B. This ensures that sub-pixels located in different pixels are driven by different pixel circuits to achieve Real display.

Figure 6:
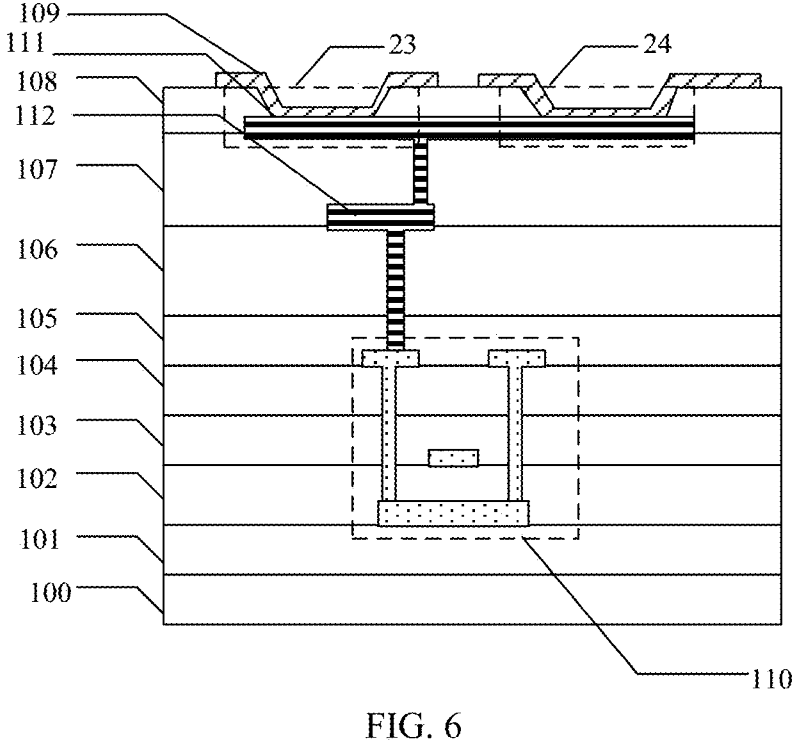
FIG. 6 illustrates a schematic diagram of a partial cross-sectional structure of another display panel according to various embodiments of the present disclosure.
Figure 7:
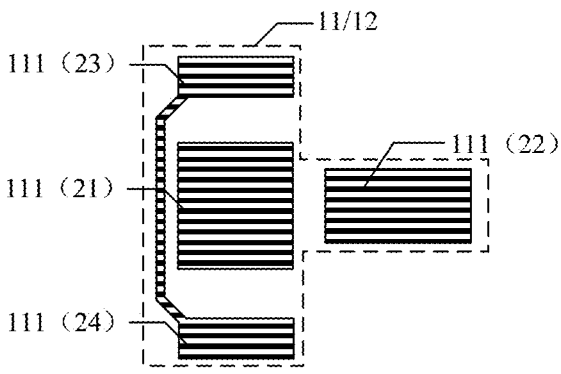
FIG. 7 illustrates a schematic diagram of a partially patterned anode structure of a display panel according to various embodiments of the present disclosure.

FIG. 6 shows a film layer structure at the position of the third sub-pixel 23 and the fourth sub-pixel 24 in one pixel. FIG. 7 shows a patterned anode corresponding to each sub-pixel in one pixel. In the pixel, the third sub-pixel 23 and the fourth sub-pixel 24 are connected to a same pixel driving circuit 110 through the anode 111.

Specifically, from the perspective of the film structure shown in FIG. 6, the third sub-pixel 23 and the fourth sub-pixel 24 are connected to a same anode 111 and are correspondingly connected to a same pixel driving circuit 110. From the perspective of the anode patterning shown in FIG. 7, the third sub-pixel 23 and the fourth sub-pixel 24 are respectively connected to two different anodes, and the two different anodes are electrically connected through a wire in an anode film layer. Thus, a same pixel driving circuit 110 is connected correspondingly.

Although one pixel provided in embodiments of the present disclosure includes four sub-pixels, it can avoid increasing the quantity of pixel driving circuits in the display panel and save the area of the display panel by driving sub-pixels of a same color to emit light through one pixel driving circuit.

Figure 8:
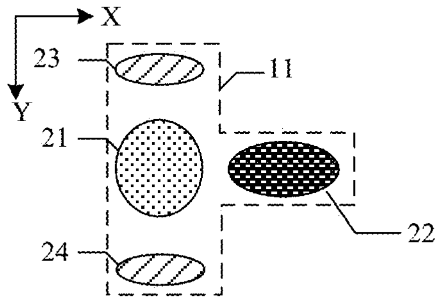
FIG. 8 illustrates a schematic diagram of a partial pixel arrangement structure of another display panel according to various embodiments of the present disclosure.

Optionally, a shape of each sub-pixel in the display panel can be a rectangle as shown in embodiments of FIG. 1 to FIG. 3, an ellipse as shown in FIG. 8, or other shapes. Embodiments of the present disclosure do not restrict the shape of each sub-pixel.

In some embodiments, as shown in FIG. 1, along the matrix column direction, the third sub-pixel 23 and the fourth sub-pixel 24 are respectively arranged adjacently over opposing sides of the first sub-pixel 21. Along the matrix row direction (i.e., X direction in FIG. 1), the second sub-pixel 22 is arranged adjacently to one side of the first sub-pixel 21.

The above arrangement of sub-pixels enables adjacent sub-pixels of a same color to form a regular rectangular area, simplifying a shape of the deposition opening of a corresponding mask as well as the manufacturing process of the corresponding mask.

Figure 9:
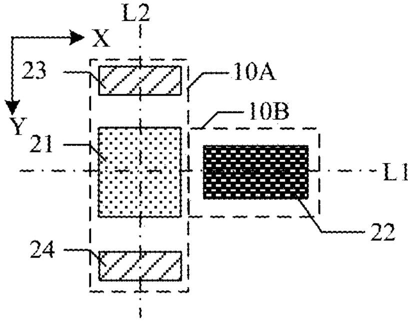
FIG. 9 illustrates a schematic diagram of a partial pixel arrangement structure of another display panel according to various embodiments of the present disclosure.

In some embodiments, as shown in FIG. 9, in one pixel, the first sub-pixel 21, the second sub-pixel 22, the third sub-pixel 23, and the fourth sub-pixel 24 are arranged to form a convex pattern. The convex pattern includes a first rectangular pattern 10A and a second rectangular pattern 10B. The first sub-pixel 21, the third sub-pixel 23, and the fourth sub-pixel 24 are arranged to form a first rectangular pattern 10A. The second sub-pixel 22 forms a second rectangular pattern 10B.

Specifically, as shown in FIG. 9, in one pixel, in the matrix row direction, centers of the first sub-pixel 21 and the second sub-pixel 22 are located on a same line L1. In the matrix column direction, centers of the first sub-pixel 21, the third sub-pixel 23, and the fourth sub-pixel 24 are located on a same line L2. This arrangement makes a plurality of sub-pixels in one pixel more concentrated, making the pixel display effect more delicate and improving the display effect.

In some embodiments, the first sub-pixel includes a green organic light-emitting material. The second sub-pixel includes a red organic light-emitting material. The third sub-pixel and the fourth sub-pixel include a blue organic light-emitting material. In some embodiments, the first sub-pixel includes a green organic light-emitting material. The second sub-pixel includes a blue organic light-emitting material. The third sub-pixel and the fourth sub-pixel include red organic light-emitting material.

Specifically, as shown in FIG. 1, the first sub-pixel 21 in the first pixel 11 includes the green organic light-emitting material. The second sub-pixel 22 includes the blue organic light-emitting material. The third sub-pixel 23 and the fourth sub-pixel 24 include the red organic light-emitting material. At the same time, the first sub-pixel 21 in the second pixel 12 includes the green organic light-emitting material. The second sub-pixel 22 includes the red organic light-emitting material. The third sub-pixel 23 and the fourth sub-pixel 24 include the blue organic light-emitting material.

In either the first pixel 11 or the second pixel 12, a green sub-pixel is surrounded by a red sub-pixel and a blue sub-pixel. Since human eyes are more sensitive to green, the above setting can reduce the jagged edge of each pixel. Thus, it optimizes the display effect of the display panel.

In some embodiments, in each pixel, the first sub-pixel includes a green organic light-emitting material. The second sub-pixel includes a red organic light-emitting material. The third sub-pixel and the fourth sub-pixel include a blue organic light-emitting material. A sum of areas of the third sub-pixel and the fourth sub-pixel is greater than an area of the first sub-pixel or an area of the second sub-pixel. Alternatively, the first sub-pixel includes a green organic light-emitting material. The second sub-pixel includes a blue organic light-emitting material. The third sub-pixel and the fourth sub-pixel include a red organic light-emitting material. The area of the second sub-pixel is greater than the area of the first sub-pixel or the sum of areas of the third sub-pixel and the fourth sub-pixel. That means in each pixel, an area of the blue sub-pixel is larger than an area of the green sub-pixel or an area of the red sub-pixel.

Optionally, an area of each sub-pixel in each pixel can be designed according to the light-emitting efficiency of its light-emitting material. For example, if the light-emitting efficiency of a material is high, an area of the sub-pixel can be small. If the light-emitting efficiency of the material is low, the area of the sub-pixel can be large.

Since the light-emitting efficiencies of the red organic light-emitting material and the green organic light-emitting material are higher than the light-emitting efficiency of the blue organic light-emitting material, in some embodiments, in each pixel, an area of the blue sub-pixel is larger than an area of the green sub-pixel or an area of the red sub-pixel.

Optionally, an area of each sub-pixel in each pixel can be designed according to the material life of its light-emitting material. For example, if the light-emitting material has a long life, an area of the sub-pixel can be small. If the light-emitting material has a short life, then the area of the sub-pixel can be large.

Since the material life of the red organic light-emitting material and the material life of the green organic light-emitting material are higher than the material life of the blue organic light-emitting material, in some embodiments, in each pixel, the area of the blue sub-pixel is larger than the area of the green sub-pixel or the area of the red sub-pixel.

In some embodiments, in each pixel, the first sub-pixel includes the green organic light-emitting material. The second sub-pixel includes the red organic light-emitting material. The third sub-pixel and the fourth sub-pixel include the blue organic light-emitting material. The sum of areas of the third sub-pixel and the fourth sub-pixel is greater than the area of the first sub-pixel. The area of the first sub-pixel is greater than the area of the second sub-pixel. Alternatively, the first sub-pixel includes a green organic light-emitting material. The second sub-pixel includes a blue organic light-emitting material. The third sub-pixel and the fourth sub-pixel include a red organic light-emitting material. The area of the second sub-pixel is greater than the sum of areas of the third sub-pixel and the fourth sub-pixel. The sum of areas of the third sub-pixel and the fourth sub-pixel is greater than the area of the first sub-pixel. That is, in each pixel, an area of the blue sub-pixel is greater than an area of the green sub-pixel. An area of the green sub-pixel is greater than an area of the red sub-pixel.

Optionally, an area of each sub-pixel in each pixel can be designed according to the light-emitting efficiency of its light-emitting material. For example, if the light-emitting efficiency of the light-emitting material is high, the area of the sub-pixel can be small. If the light-emitting efficiency of the light-emitting material is low, then the area of the sub-pixel can be large.

Since the light-emitting efficiency of the red organic light-emitting material is higher than the light-emitting efficiency of the green organic light-emitting material, and the light-emitting efficiency of the green organic light-emitting material is higher than the light-emitting efficiency of the blue organic light-emitting material, in some embodiments, in each pixel, the area of the blue sub-pixel is larger than the area of the green sub-pixel, and the area of the green sub-pixel is larger than the area of the red sub-pixel.

Optionally, the area of each sub-pixel in each pixel can be designed according to the material life of its light-emitting material. For example, if the light-emitting material has a long material life, the area of the sub-pixel can be small. If the light-emitting material has a short material life, then the area of the sub-pixel can be large.

As the material life of the red organic light-emitting material is higher than the material life of the green organic light-emitting material, and the material life of the green organic light-emitting material is longer than the material life of the blue organic light-emitting material, in some embodiments, in each pixel, the area of the blue sub-pixel is larger than the area of the green sub-pixel, and the area of the green sub-pixel is greater than the area of the red sub-pixel.

In some embodiments, in one pixel, the area of the third sub-pixel 23 is the same as the area of the fourth sub-pixel 24. Thus, two sub-pixels of a same color are symmetrical on both sides of the first sub-pixel, optimizing the display effect of a single pixel.

Optionally, as shown in FIGS. 1 to 3, along the matrix row direction, lengths of the first sub-pixel 21, the second sub-pixel 22, the third sub-pixel 23, and the fourth sub-pixel 24 in each pixel are longer than or equal to 25 microns, while less than or equal to 100 microns. Along the matrix column direction, the length of the first sub-pixel 21 in each pixel is longer than or equal to 25 microns but less than or equal to 100 microns, and the length of the second sub-pixel 22 is greater than or equal to 25 microns but less than or equal to 150 microns. Both lengths of the third sub-pixel 23 and the fourth sub-pixel 24 are longer than or equal to 10 microns but less than or equal to 30 microns.

Figure 10:
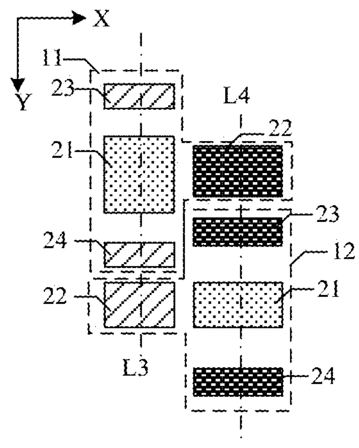
FIG. 10 illustrates a schematic diagram of a partial pixel arrangement structure of another display panel according to various embodiments of the present disclosure.

In some embodiments, the display panel includes a plurality of pixel groups. The plurality of pixel groups is arranged in a matrix. One pixel group is shown in FIG. 10. Each pixel group includes a first pixel 11 and an adjacent second pixel 12.

In one pixel group, the first sub-pixel 21 of the first pixel 11 and the first sub-pixel 21 of the second pixel 12 have a same color. The third sub-pixel 23 and the fourth sub-pixel 24 of the first pixel 11 have a same color as the second sub-pixel 22 of the second pixel 12. The third sub-pixel 23 and the fourth sub-pixel 24 of the second pixel 12 have a same color as the second sub-pixel 22 of the first pixel 11.

The third sub-pixel or the fourth sub-pixel of the first pixel is adjacent to the second sub-pixel of the second pixel. The light-emitting layer of the third sub-pixel or the light-emitting layer of the fourth sub-pixel of the first pixel is connected to the light-emitting layer of the second sub-pixel of the second pixel. The third sub-pixel or the fourth sub-pixel of the second pixel is adjacent to the second sub-pixel of the first pixel. The light-emitting layer of the third sub-pixel or the light-emitting layer of the fourth sub-pixel of the second pixel is connected to the light-emitting layer of the second sub-pixel of the first pixel. In one embodiment shown in FIG. 10, the fourth sub-pixel 24 of the first pixel 11 is adjacent to the second sub-pixel 22 of the second pixel 12 and their light-emitting layers are connected. The third sub-pixel 23 of the second pixel 12 is adjacent to the second sub-pixel 22 of the first pixel 11 and their light-emitting layers are connected.

Specifically, for the first pixel 11 in FIG. 10, the second pixel 12 that constitutes a pixel group with the first pixel 11 can be located below the first pixel 11 along the matrix column direction or can be located above the first pixel 11 along the matrix column direction. In subsequent embodiments of the present disclosure, the first pixel 11 and the second pixel 12 marked in FIG. 10 are regarded as a pixel group. Those persons of ordinary skill in the art can take one first pixel 11 and an adjacent second pixel 12 as a pixel group.

As shown in FIG. 1, the third sub-pixel 23 or the fourth sub-pixel 21 of the first pixel 11 of one pixel group, the second sub-pixel 22 of the second pixel 12, and the third sub-pixel 23 or the fourth sub-pixel 24 of the first pixel 11 of another pixel group are arranged adjacently and their light-emitting layers are connected.

Specifically, as shown in FIG. 10, in a pixel group, along the matrix column direction, the first sub-pixel 21, the third sub-pixel 23, the fourth sub-pixel 24 of the first pixel 11 and the second sub-pixel 22 of the second pixel 12 have their centers located on a same line L3. Along the matrix column direction, centers of the first sub-pixel 21, the third sub-pixel 23, and the fourth sub-pixel 24 of the second pixel 12 together with a center of the second sub-pixel 22 of the first pixel 11 are located on a same line L4.

Specifically, as shown in FIG. 1, the third sub-pixel 23 or the fourth sub-pixel 21 of the first pixel 11 in one pixel group, the second sub-pixel 22 of the second pixel 12, and the third sub-pixel 23 or the fourth sub-pixel 24 of the first pixel 11 in another pixel group are arranged adjacently and their light-emitting layers are connected. At the same time, the second sub-pixel 22 of the first pixel 11 in one pixel group, the third sub-pixel 23 or the fourth sub-pixel 24 of the second pixel 12, and the fourth sub-pixel 24 or the third sub-pixel 23 of the second pixel 12 in another pixel group are arranged adjacently and the light-emitting layers are connected.

In some embodiments, as shown in FIG. 1, in a pixel group, an area of the first sub-pixel 21 of the first pixel 11 is the same as an area of the first sub-pixel 21 of the second pixel 12. A sum of areas of the third sub-pixel 23 and the fourth sub-pixel 24 of the first pixel 11 is the same as an area of the second sub-pixel 22 of the second pixel 12. A sum of areas of the third sub-pixel 23 and the fourth sub-pixel 24 of the second pixel 12 is equal to an area of the second sub-pixel 22 of the first pixel 11.

A pixel area of each color in each pixel is identical to ensure a uniform display of the display panel. Specifically, in the display panel, areas of each identical sub-pixel of all first pixels 11 are the same, and areas of each identical sub-pixel of all second pixels 12 are the same.

Figure 11:
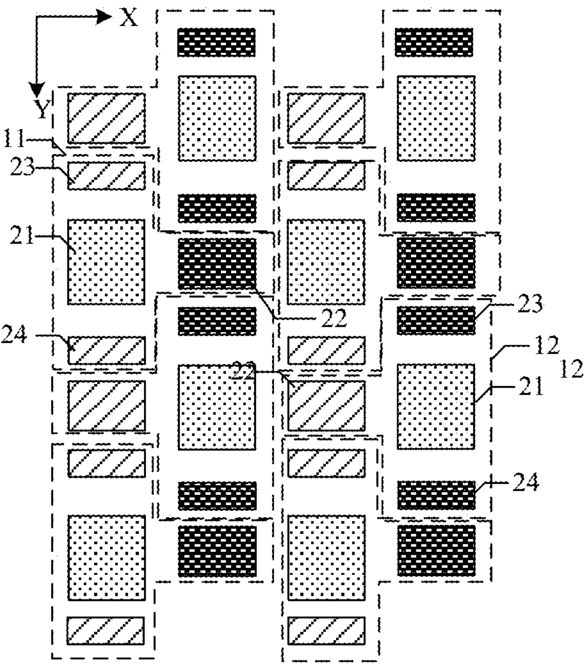
FIG. 11 illustrates a schematic diagram of a partial pixel arrangement structure of another display panel according to various embodiments of the present disclosure.

In some embodiments, as shown in FIG. 11, the second sub-pixel 22 of the first pixel 11 and the second sub-pixel 22 of the second pixel 12 have a same shape and a same size. The third sub-pixel 23 of the first pixel 11 and the third sub-pixel 23 of the second pixel 12 have a same shape and a same size. The fourth sub-pixel 24 of the first pixel 11 and the fourth sub-pixel 24 of the second pixel 12 have a same shape and a same size.

Figure 12:
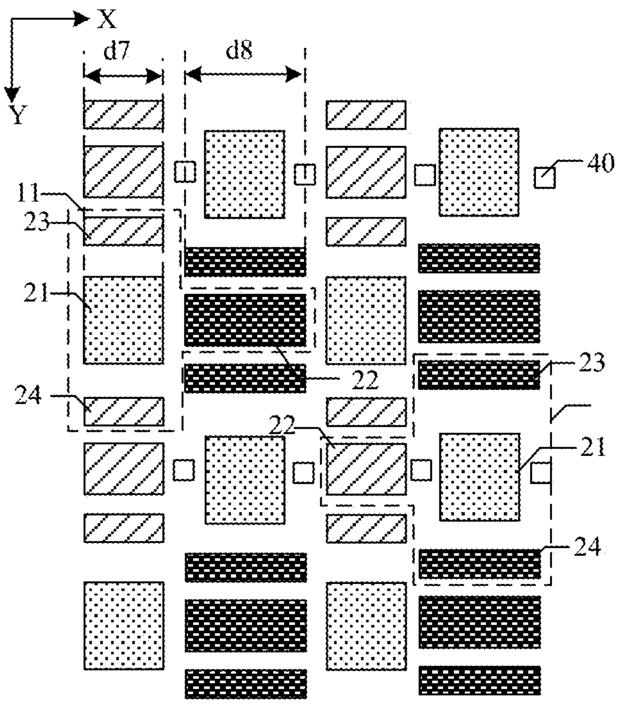
FIG. 12 illustrates a schematic diagram of a partial pixel arrangement structure of another display panel according to various embodiments of the present disclosure.

Since the second sub-pixel 22, the third sub-pixel 23, and the fourth sub-pixel 24 in each pixel need to share a deposition opening with a sub-pixel in another pixel. As shown in FIG. 12, deposition areas of the two light-emitting layers, each of which has adjacently arranged a plurality of sub-pixels with a same color, have a same size. In this way, a same mask can be used for depositing two colors, saving the cost of the mask production and manufacturing, and reducing the overall cost of the product.

In some embodiments, the first sub-pixel of the first pixel and the first sub-pixel of the second pixel include a green organic light-emitting material. The third sub-pixel and the fourth sub-pixel of the first pixel as well as the second sub-pixel of the second pixel include a red organic light-emitting material. The third sub-pixel and the fourth sub-pixel of the second pixel as well as the second sub-pixel of the first pixel include a blue organic light-emitting material.

In a pixel group, whether it is the first pixel or the second pixel, a green sub-pixel is surrounded by the red sub-pixel and the blue sub-pixel. Since the human eye is more sensitive to green, the above setting can reduce the jagged feeling of the edge of each pixel. This optimizes the display effect of the display panel. Moreover, in the pixel group, quantities of the red sub-pixel, the green sub-pixel, and the blue sub-pixel have a ratio of 3:2:3, which can achieve a delicate display effect.

In some embodiments, as shown in FIG. 12, the first sub-pixel 21 of the first pixel 11 and the first sub-pixel 21 of the second pixel 12 have a same shape and a same size. The area of the second sub-pixel 22 of the first pixel 11 is greater than the area of the second sub-pixel 22 of the second pixel 12. The area of the third sub-pixel 23 of the second pixel 12 is greater than the area of the third sub-pixel 23 of the first pixel 11. The area of the fourth sub-pixel 24 of the second pixel 12 is greater than the area of the fourth sub-pixel 24 of the first pixel 11. The display panel further includes a support pillar 40 between the first sub-pixel 21 and the second sub-pixel 22 of the second pixel 12.

As shown in FIG. 12, a larger area of the second sub-pixel 22 of the first pixel 11 with respect to the second sub-pixel 22 of the second pixel 12 is mainly reflected by a longer length d8 of the second sub-pixel 22 of the first pixel 11 with respect to a length d7 of the second sub-pixel 22 of the second pixel 12 along the matrix row direction. A larger area of the third sub-pixel 23 of the second pixel 12 with respect to the third sub-pixel 23 of the first pixel 11 is mainly reflected by a longer length d8 of the third sub-pixel 23 of the second pixel 12 with respect to a length d7 of the third sub-pixel 23 of the first pixel 11 along the matrix row direction. A larger area of the fourth sub-pixel 24 of the second pixel 12 with respect to the fourth sub-pixel 24 of the first pixel 11 is mainly reflected by a longer length d8 of the fourth sub-pixel 24 of the second pixel 12 with respect to a length d7 of the fourth sub-pixel 24 of the first pixel 11 along the matrix row direction. Furthermore, due to an identical size of the first sub-pixels, there exists a relatively large vacant area between the first sub-pixel 21 and the second sub-pixel 22 of the second pixel 12, which can be utilized for making support pillars.

Figure 13:
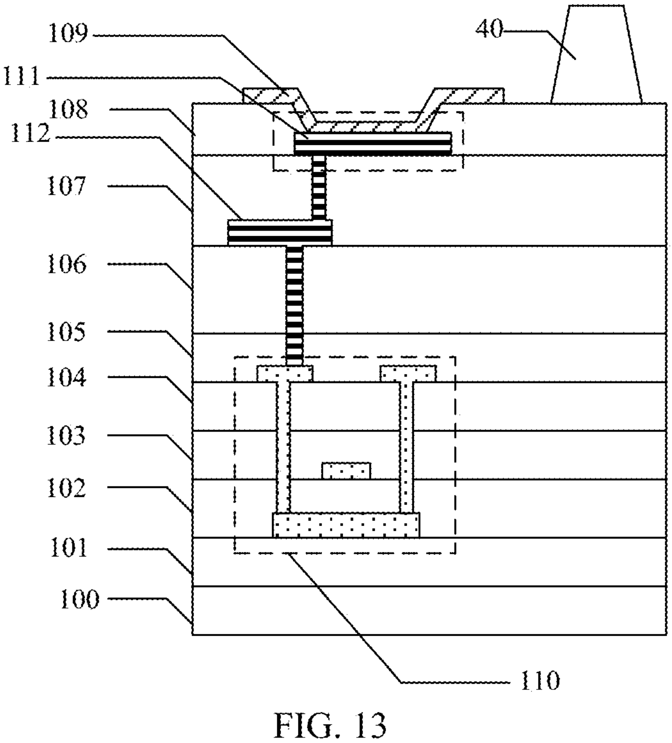
FIG. 13 illustrates a schematic diagram of a partial cross-sectional structure of another display panel according to various embodiments of the present disclosure.

As shown in FIG. 13, the support pillars 40 are located on one side of the pixel defining layer 108 away from the substrate 100. The support pillars 40 are fabricated before the light-emitting layer 109, serving to prevent direct contact between the mask and the pixel defining layer 108 during vapor deposition, thereby avoiding damage to the pixel defining area. The above embodiments reserve pixel vacant areas for the support pillars through a special pixel arrangement method, maximizing a distance between the support pillar and each sub-pixel. This minimizes a distance between the support pillar and the deposition opening of each mask, preventing the deposition opening of the mask from scratching the support pillar, ensuring the structural strength of the support pillar, and improving the yield of the display panel.

Optionally, the support pillar 40 comprises an organic material such as polyimide. Fabricating the support pillar 40 on the display panel includes mask etching.

Optionally, a height of the support pillar 40 in a thickness direction of the display panel is greater than or equal to 2 microns but less than or equal to 4 microns. A projection of the support pillar 40 on the display panel can fully cover a circle with a diameter greater than or equal to 5 microns.

Figures 14, 15:
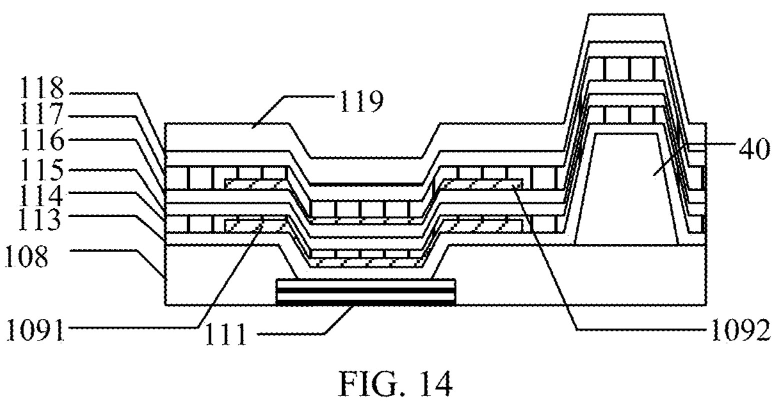
FIG. 14 illustrates a schematic diagram of a partial cross-sectional structure of another display panel according to various embodiments of the present disclosure.
FIG. 15 illustrates a schematic diagram of a partial pixel arrangement structure of another display panel according to various embodiments of the present disclosure.

Optionally, as shown in FIG. 14, a light-emitting layer 109 specifically includes, in sequence, a first hole transport layer 113, a first light-emitting material layer 1191, a first electron transport layer 114, a common electrode layer 115, a second hole transport layer 116, a second light-emitting material layer 1192, a second electron transport layer 117, an electron injection layer 118, and a semi-transparent cathode layer 119, which are stacked on the anode 111 and the pixel defining layer 108. Except for the first light-emitting material layer 1191 and the second light-emitting material layer 1192, the first hole transport layer 113, the first electron transport layer 114, the common electrode layer 115, the second hole transport layer 116, the second electron transport layer 117, the electron injection layer 118, and the semi-transparent cathode layer 119 are also sequentially stacked on the support pillar 40, for an entire layer deposition.

Optionally, a shape of the projection of the support pillar 40 on the display panel can be rectangular, as shown in FIG. 12. In some embodiments, the shape of the projection of the support pillar 40 on the display panel can also be circular, triangular, or other shapes.

In some embodiments, as shown in FIG. 1, along the matrix row direction, the first pixel 11 is cyclically arranged, and the second pixel 12 is cyclically arranged. Along the matrix column direction, the first pixels 11 and the second pixels 12 are alternately arranged, forming cyclic pixel groups, where the matrix row direction intersects with the matrix column direction.

Specifically, as shown in FIG. 2, for sub-pixels with a same color and connected light-emitting layers in adjacent pixels, the positions of the sub-pixels are considered as deposition areas. The display panel includes the first light-emitting layer deposition area 31, the second light-emitting layer deposition area 32, and the third light-emitting layer deposition area 33. Along the matrix row direction, the first light-emitting layer deposition area 31 and the third light-emitting layer deposition area 33 alternate in the nth matrix row. The second light-emitting layer deposition area 32 and the third light-emitting layer deposition area 33 alternate in the (n+1)-th matrix row. The nth and (n+1)-th matrix rows are offset to ensure that the first light-emitting layer deposition area 31 in the nth matrix row and the third light-emitting layer deposition area 33 in the (n+1)-th matrix row are located in a same matrix column. Along the matrix column direction, the first light-emitting layer deposition area 31 and the third light-emitting layer deposition area 33 alternate in the nth matrix column, while the second light-emitting layer deposition area 32 and the third light-emitting layer deposition area 33 alternate in the (n+1)-th matrix column. The nth and (n+1)-th matrix columns are offset to ensure that the first light-emitting layer deposition area 31 in the nth matrix column and the third light-emitting layer deposition area 33 in the (n+1)-th matrix column is located in a same matrix column, where n is a positive integer.

In some embodiments, as shown in FIG. 15, along the matrix row direction, centers of a plurality of first sub-pixels 21 and the second sub-pixel 22 of the first pixel 11 are located on a same line L5. Centers of a plurality of first sub-pixels 21 and the second sub-pixel 22 of the second pixel 12 are located on a same line L6.

Along the matrix column direction, centers of the first sub-pixel 21, the third sub-pixel 23, and the fourth sub-pixel 24 of the first pixel 11, as well as centers of a plurality of second sub-pixels 22 of the second pixel 12, are located on a same line L7. Centers of the first sub-pixel 21, the third sub-pixel 23, and the fourth sub-pixel 24 of the second pixel 12, as well as centers of a plurality of second sub-pixels 22 of the first pixel 11, are located on a same line L8.

A regular array arrangement of pixels leads to a regular shape of the deposition opening corresponding to the light-emitting layer, reducing the manufacturing cost of the mask.

Figure 16:
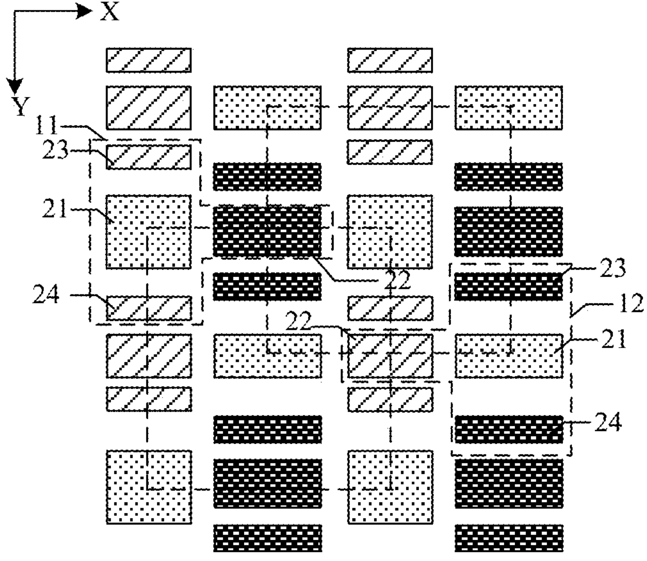
FIG. 16 illustrates a schematic diagram of a partial pixel arrangement structure of another display panel according to various embodiments of the present disclosure.

In some embodiments, as shown in FIG. 16, a distance between centers of first sub-pixels 21 of adjacent two first pixels 11 along the matrix column direction is equal to a distance between centers of first sub-pixels 21 of adjacent two first pixels 11 along the matrix row direction. A distance between centers of first sub-pixels 21 of adjacent two second pixels 12 along the matrix column direction is equal to a distance between centers of first sub-pixels 21 of adjacent two second pixels 12 along the matrix row direction. That is, centers of four adjacent first sub-pixels 21 of the first pixel 11 along the matrix row direction and the matrix column direction form a virtual square. Similarly, centers of four adjacent first sub-pixels 21 of the second pixel 12 along the matrix row direction and the matrix column direction form a virtual square.

Figure 17:
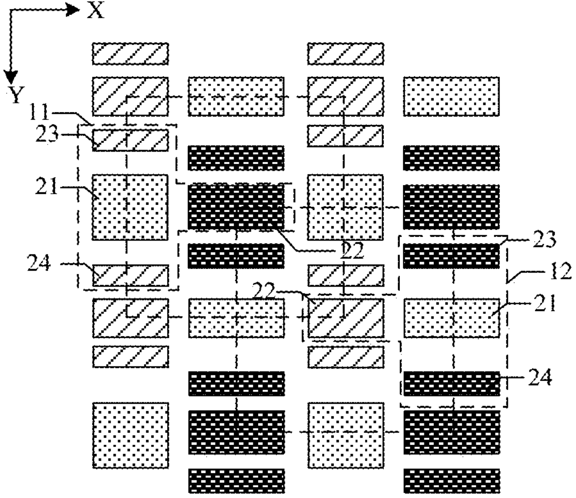
FIG. 17 illustrates a schematic diagram of a partial pixel arrangement structure of another display panel according to various embodiments of the present disclosure.

In some embodiments, as shown in FIG. 17, a distance between centers of the second sub-pixels 22 of two adjacent first pixels 11 along the matrix column direction is equal to a distance between centers of the second sub-pixels 22 of adjacent two first pixels 11 along the matrix row direction. A distance between centers of the second sub-pixel 22 of adjacent two second pixels 12 along the matrix column direction is equal to a distance between centers of the second sub-pixels 22 of adjacent two second pixels 12 along the matrix row direction. That is, centers of four adjacent second sub-pixels 22 of the first pixel 11 along the matrix row direction and the matrix column direction form a virtual square. Similarly, centers of four adjacent second sub-pixels 22 of the second pixel 12 along the matrix row direction and the matrix column direction form a virtual square.

Specifically, centers of the third sub-pixel 23 of four adjacent first pixels 11 along the matrix row direction and the matrix column direction form a virtual square. Similarly, centers of the third sub-pixel 23 of four adjacent second pixels 12 along the matrix row direction and matrix column direction form a virtual square. Centers of four adjacent first pixels 11 along the matrix row direction and the matrix column direction form a virtual square. Centers of the fourth sub-pixel 24 of four adjacent second pixels 12 along the matrix row direction and the matrix column direction form a virtual square.

Figure 18:
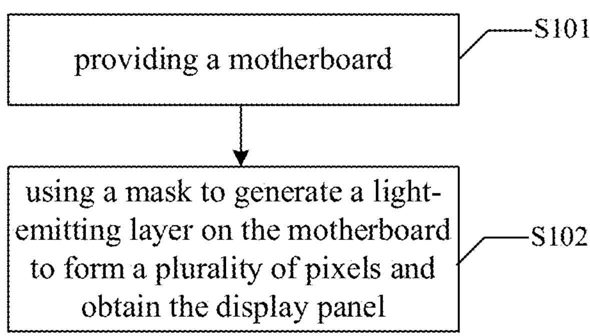
FIG. 18 illustrates a schematic flow chart of a manufacturing method of a display panel according to various embodiments of the present disclosure.

Based on the same inventive concept as the aforementioned embodiments of the display panel, an embodiment of the present disclosure further provides a manufacturing method for the display panel, as shown in FIG. 18.

S101, providing a motherboard.

S102, utilizing a mask to generate a light-emitting layer on the motherboard and form a plurality of pixels to obtain a display panel. The plurality of pixels is arranged in a matrix. Each pixel includes a first sub-pixel, a second sub-pixel, a third sub-pixel, and a fourth sub-pixel. The third sub-pixel and the fourth sub-pixel have a same color. In one pixel, the first sub-pixel is adjacent to the second sub-pixel, the third sub-pixel, and the fourth sub-pixel. Along a matrix row direction or a matrix column direction, at least some sub-pixels of a same color are adjacent to each other in adjacent pixels. Sub-pixels of the same color in adjacent pixels share a deposition opening of the mask.

A pixel arrangement method provided by the present disclosure allows sub-pixels in one pixel to be adjacent to sub-pixels in another pixel, where adjacent sub-pixels of a same color are connected by their light-emitting layers and share a deposition opening. This increases the aperture ratio of the display panel and improves the display effect and the service life of the display panel. Meanwhile, dividing a pixel into four sub-pixels makes the display effect more delicate, further enhancing the display effect of the display panel.

Figure 19:
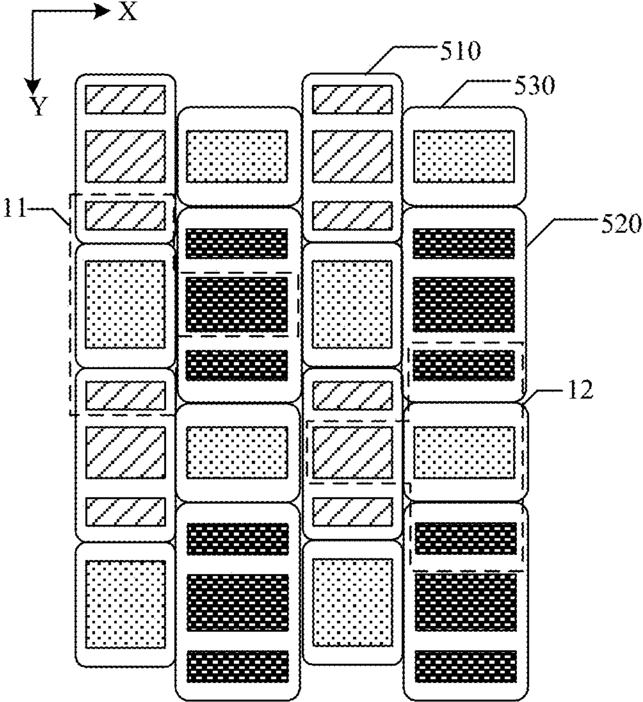
FIG. 19 illustrates a partial relative position and structural diagram of deposition openings and deposition areas of a mask according to various embodiments of the present disclosure.
Figure 20:
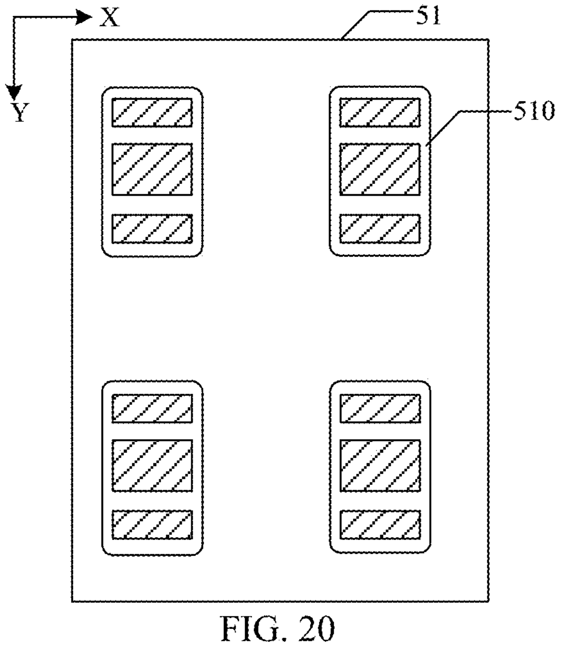
FIG. 20 illustrates another partial relative position and structural diagram of deposition openings and deposition areas of a mask according to various embodiments of the present disclosure.
Figure 21:
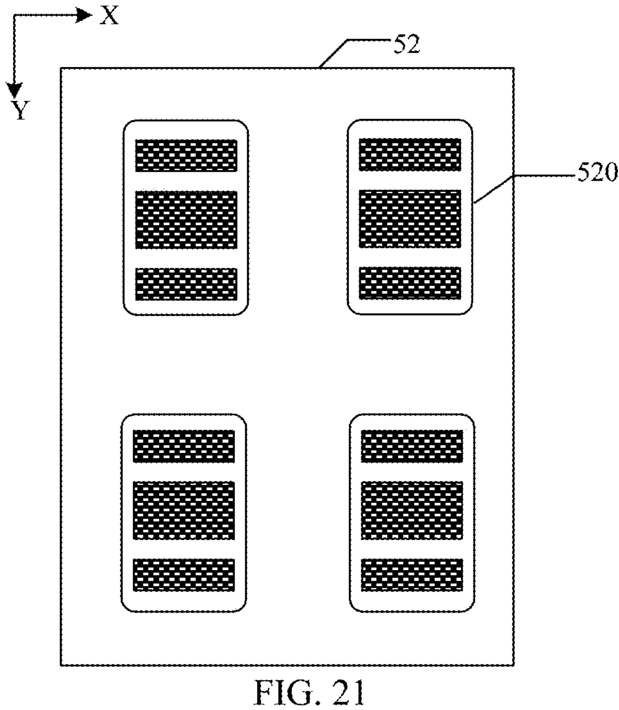
FIG. 21 illustrates another partial relative position and structural diagram of deposition openings and deposition areas of a mask according to various embodiments of the present disclosure.
Figure 22:
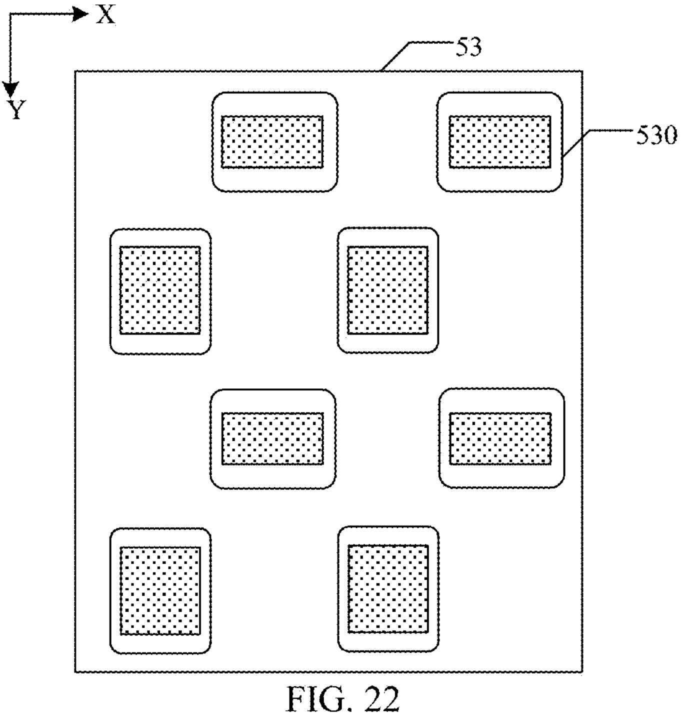
FIG. 22 illustrates another partial relative position and structural diagram of deposition openings and deposition areas of a mask according to various embodiments of the present disclosure.

Specifically, as shown in FIG. 2, positions of sub-pixels in adjacent pixels with a same color and connected by the light-emitting layers constitute a deposition area. The display panel includes a first light-emitting layer deposition area 31, a second light-emitting layer deposition area 32, and a third light-emitting layer deposition area 33. The mask used in the above method is shown in FIGS. 19 to 22, where FIG. 19 illustrates a schematic diagram of the overlay of three masks corresponding to three deposition areas. FIG. 20 illustrates a schematic diagram of a first mask 51 corresponding to a first light-emitting layer deposition area, including a plurality of first color deposition openings 510. FIG. 21 illustrates a schematic diagram of a second mask 52 corresponding to a second light-emitting layer deposition area, including a plurality of second color deposition openings 520. FIG. 22 illustrates a schematic diagram of the third mask 53 corresponding to a third light-emitting layer deposition area, including a plurality of third color deposition openings 530. It can be seen from FIGS. 19 to 22 that in the manufacturing method of the display panel provided by the present disclosure, due to its unique pixel arrangement, the spacing between each deposition opening in the mask is relatively large. This simplifies the production process of the mask and saves production costs.

Optionally, when light-emitting efficiencies and service lives of the green organic light-emitting material, the red organic light-emitting material, and the blue organic light-emitting material are comparable, dimensions of the first light-emitting layer deposition area 31 and the second light-emitting layer deposition area 32 are identical. As a result, the first mask 51 and the second mask 52 shown in FIGS. 20 to 21 can use a same mask, saving the production cost of the mask and reducing the overall product cost.

Optionally, a minimum distance between any two deposition openings in the first mask, the second mask, and the third mask is greater than or equal to 15 microns.

Optionally, an aspect ratio of a deposition opening in the first mask, the second mask, and the third mask is less than or equal to 1.5.

Optionally, in an embodiment shown in FIG. 19, projections of deposition openings of the three masks on the display panel are adjacent, ensuring a high aperture ratio. In some embodiments, due to the presence of a deposition margin, the projections of deposition openings of the three masks on the display panel can partially overlap.

The method of the above embodiments is used to implement the corresponding display panel in any of the preceding embodiments and has beneficial effects on the corresponding display panel embodiments.

Based on the same inventive concept as the aforementioned display panel embodiments, an embodiment of the present disclosure also provides a display apparatus, comprising the display panel of any of the preceding embodiments.

The display apparatus in embodiments of the present disclosure can be any apparatuses with a display function such as a mobile phone, a tablet, a laptop, an e-reader, a television, a smartwatch, and the like.

The display apparatus in the above embodiments includes the corresponding display panel of the preceding embodiments and has the beneficial effects of the corresponding display panel embodiments, which are not repeated here.

It should be noted that, in the present disclosure, relational terms such as "first" and "second" are used merely to distinguish one entity or operation from another, and do not necessarily imply any actual relationship or order between these entities or operations. Additionally, terms such as "comprising", "including", or any other variants are intended to cover non-exclusive inclusion, such that a process, method, article, or device comprising a series of elements includes not only those elements expressly listed but also other elements not expressly listed, or elements that are inherently present. In the absence of further limitations, the elements defined by statements such as "comprising a . . . " do not exclude the presence of additional identical elements in processes, methods, articles, or devices that include the defined elements. The principles and novel features disclosed herein can be practiced in other embodiments without departing from the spirit and scope of the present disclosure.

The above is only specific embodiments of the present disclosure, allowing those persons of ordinary skill in the art to understand or implement the present disclosure. Various modifications to these embodiments will be readily apparent to those persons of ordinary skill in the art, and the general principles defined herein can be applied to other embodiments without departing from the spirit or scope of the present disclosure. Therefore, the present disclosure is not limited to embodiments described herein, but encompasses the widest scope consistent with the principles and novel features disclosed herein.

What is claimed is:

1. A display panel, comprising:

a plurality of pixels, wherein the plurality of pixels is arranged in a matrix;

the plurality of pixels comprising at least a first pixel, a second pixel, and a third pixel arranged in a matrix row direction;

the first pixel and the third pixel each comprises a first sub-pixel, a second sub-pixel, a third sub-pixel, and a fourth sub-pixel, wherein the third sub-pixel and the fourth sub-pixel have a same color, the first sub-pixel is adjacent to the second sub-pixel in a matrix row direction, and the first sub-pixel is between the third sub-pixel and the fourth sub-pixel in a matrix column direction; and the second pixel comprises a first sub-pixel, a second sub-pixel, a third sub-pixel, and a fourth sub-pixel; and wherein the fourth sub-pixel of the first pixel, the second sub-pixel of the second pixel, and the third sub-pixel of the third pixel are adjacently arranged in the matrix column direction and share a connected light-emitting layer.

2. The display panel according to claim 1, wherein, in each of the first pixel and the third pixel, the first sub-pixel, the second sub-pixel, the third sub-pixel, and the fourth sub-pixel are arranged to form a convex pattern; the convex pattern comprises a first rectangular pattern and a second rectangular pattern; the first sub-pixel, the third sub-pixel, and the fourth sub-pixel are arranged to form the first rectangular pattern; and the second sub-pixel forms the second rectangular pattern.

3. The display panel according to claim 1, further comprising an anode, wherein, in each of the first pixel, the second pixel, and the third pixel, the third sub-pixel and the fourth sub-pixel are connected to a same pixel driving circuit through the anode.

4. The display panel according to claim 1, wherein, in each of the first pixel and the third pixel, the first sub-pixel comprises a green organic light-emitting material, the second sub-pixel comprises a red organic light-emitting material, and the third sub-pixel and the fourth sub-pixel comprise a blue organic light-emitting material; or the first sub-pixel comprises the green organic light-emitting material, the second sub-pixel comprises the blue organic light-emitting material, and the third sub-pixel and the fourth sub-pixel comprise the red organic light-emitting material.

5. The display panel according to claim 1, wherein, in each of the first pixel, the second pixel, and the third pixel, the first sub-pixel comprises a green organic light-emitting material, the second sub-pixel comprises a red organic light-emitting material, and the third sub-pixel and the fourth sub-pixel comprise a blue organic light-emitting material; a sum of areas of the third sub-pixel and the fourth sub-pixel is greater than an area of the first sub-pixel or an area of the second sub-pixel; or the first sub-pixel comprises the green organic light-emitting material, the second sub-pixel comprises the blue organic light-emitting material, the third sub-pixel and the fourth sub-pixel comprise the red organic light-emitting material; the area of the second sub-pixel is greater than the area of the first sub-pixel or the sum of areas of the third sub-pixel and the fourth sub-pixel.

6. The display panel according to claim 1, wherein, in each of the first pixel, the second pixel, and the third pixel, the first sub-pixel comprises a green organic light-emitting material, the second sub-pixel comprises a red organic light-emitting material, the third sub-pixel and the fourth sub-pixel comprise a blue organic light-emitting material; a sum of areas of the third sub-pixel and the fourth sub-pixel is greater than an area of the first sub-pixel; the area of the first sub-pixel is greater than an area of the second sub-pixel; or, the first sub-pixel comprises the green organic light-emitting material, the second sub-pixel comprises the blue organic light-emitting material, the third sub-pixel and the fourth sub-pixel comprise the red organic light-emitting material; the area of the second sub-pixel is greater than the sum of areas of the third sub-pixel and the fourth sub-pixel, and the sum of areas of the third sub-pixel and the fourth sub-pixel is greater than the area of the first sub-pixel.

7. The display panel according to claim 1, wherein, in each of the first pixel, the second pixel, and the third pixel, an area of the third sub-pixel is same as an area of the fourth sub-pixel.

8. The display panel according to claim 1, wherein an area of the first sub-pixel of the first pixel equals an area of the first sub-pixel of the second pixel; a sum of areas of the third sub-pixel and the fourth sub-pixel of the first pixel equals an area of the second sub-pixel of the second pixel; and a sum of areas of the third sub-pixel and the fourth sub-pixel of the second pixel equals an area of the second sub-pixel of the first pixel.

9. The display panel according to claim 8, wherein the second sub-pixel of the first pixel and the second sub-pixel of the second pixel have a same shape and a same size;

the third sub-pixel of the first pixel and the third sub-pixel of the second pixel have a same shape and a same size; and the fourth sub-pixel of the first pixel and the fourth sub-pixel of the second pixel have a same shape and a same size.

10. The display panel according to claim 1, wherein the first sub-pixel of the first pixel and the first sub-pixel of the second pixel comprise a green organic light-emitting material; the third sub-pixel and the fourth sub-pixel of the first pixel and the second sub-pixel of the second pixel comprise a red organic light-emitting material; and the third sub-pixel and the fourth sub-pixel of the second pixel and the second sub-pixel of the first pixel comprise a blue organic light-emitting material.

11. The display panel according to claim 10, wherein the first sub-pixel of the first pixel and the first sub-pixel of the second pixel have a same shape and a same size; an area of the second sub-pixel of the first pixel is larger than an area of the second sub-pixel of the second pixel; an area of the third sub-pixel of the second pixel is greater than an area of the third sub-pixel of the first pixel; an area of the fourth sub-pixel of the second pixel is greater than an area of the fourth sub-pixel of the first pixel; and the display panel further comprises a support pillar between the first sub-pixel and the second sub-pixel of the second pixel.

12. The display panel according to claim 1, wherein along the matrix row direction, a plurality of the first pixel are arranged in a cyclical manner, and a plurality of the second pixel are arranged in the cyclical manner; and the matrix row direction intersects the matrix column direction.

13. The display panel according to claim 12, wherein along the matrix row direction, centers of first sub-pixels and second sub-pixels of the plurality of first pixels are located on a same line; centers of the first sub-pixels and the second sub-pixels of the plurality of second pixel are located on a same line; and along the matrix column direction, centers of the first sub-pixel, the third sub-pixel, and the fourth sub-pixel of the first pixel are located on a same line with a center of the second sub-pixel of the second pixel; centers of the first sub-pixel, the third sub-pixel, and the fourth sub-pixel of the second pixel are located on a same line with a center of the second sub-pixel of the first pixel.

14. The display panel according to claim 13, wherein a distance between centers of the first sub-pixel of the first pixel and the first sub-pixel of the third pixel along the matrix column direction is equal to a distance between centers of the first sub-pixels of two adjacent first pixels of the plurality of first pixels along the matrix row direction; a distance between centers of the first sub-pixels of two adjacent second pixels of the plurality of second pixels along the matrix column direction is equal to a distance between centers of the first sub-pixels of two adjacent second pixels of the plurality of second pixels along the matrix row direction; a distance between centers of the second sub-pixel of the first pixel and the first sub-pixel of the third pixel along the matrix column direction is equal to a distance between centers of the second sub-pixels of two adjacent first pixels of the plurality of first pixels along the matrix row direction; and a distance between centers of the second sub-pixels of two adjacent second pixels of the plurality of second pixels along the matrix column direction is equal to a distance between centers of the second sub-pixels of two adjacent second pixels of the plurality of second pixels along the matrix row direction.

15. A manufacturing method of a display panel, comprising:

providing a motherboard;

using a mask to generate a light-emitting layer on the motherboard to form a plurality of pixels and obtain the display panel, wherein the plurality of pixels is arranged in a matrix;

the plurality of pixels comprising at least a first pixel, a second pixel, and a third pixel arranged in a matrix row direction;

the first pixel and the third pixel each comprises a first sub-pixel, a second sub-pixel, a third sub-pixel, and a fourth sub-pixel, wherein the third sub-pixel and the fourth sub-pixel have a same color, the first sub-pixel is adjacent to the second sub-pixel in a matrix row direction, and the first sub-pixel is between the third sub-pixel and the fourth sub-pixel in a matrix column direction; and the second pixel comprises a first sub-pixel, a second sub-pixel, a third sub-pixel, and a fourth sub-pixel; and wherein the fourth sub-pixel of the first pixel, the second sub-pixel of the second pixel, and the third sub-pixel of the third pixel are adjacently arranged in the matrix column direction and share a connected light-emitting layer.

16. A display apparatus, comprising:

a display panel comprising a plurality of pixels, wherein the plurality of pixels is arranged in a matrix;

the plurality of pixels comprising at least a first pixel, a second pixel, and a third pixel arranged in a matrix row direction;

the first pixel and the third pixel each comprises a first sub-pixel, a second sub-pixel, a third sub-pixel, and a fourth sub-pixel, wherein the third sub-pixel and the fourth sub-pixel have a same color, the first sub-pixel is adjacent to the second sub-pixel in a matrix row direction, and the first sub-pixel is between the third sub-pixel and the fourth sub-pixel in a matrix column direction; and the second pixel comprises a first sub-pixel, a second sub-pixel, a third sub-pixel, and a fourth sub-pixel; and wherein the fourth sub-pixel of the first pixel, the second sub-pixel of the second pixel, and the third sub-pixel of the third pixel are adjacently arranged in the matrix column direction and share a connected light-emitting layer.

* * * * *